(12) United States Patent
Takahashi et al.

(10) Patent No.: US 9,334,569 B2
(45) Date of Patent: May 10, 2016

(54) SAMPLE PREPARATION DEVICE TO FORM A MATRIX FILM FOR MATRIX ASSISTED LASER DESORPTION/IONIZATION METHOD

(71) Applicant: SHIMADZU CORPORATION, Kyoto (JP)

(72) Inventors: Kazuteru Takahashi, Kyoto (JP); Kiyoshi Ogawa, Kyoto (JP)

(73) Assignee: SHIMADZU CORPORATION, Kyoto (JP)

(*) Notice: Subject to any disclaimer, the term of this patent is extended or adjusted under 35 U.S.C. 154(b) by 133 days.

(21) Appl. No.: 13/674,745

(22) Filed: Nov. 12, 2012

(65) Prior Publication Data

US 2013/0171349 A1 Jul. 4, 2013

(30) Foreign Application Priority Data

Dec. 2, 2011 (JP) ................................ 2011-264663
Jul. 18, 2012 (JP) ................................ 2012-159296

(51) Int. Cl.
*C23C 14/54* (2006.01)
*C23C 14/24* (2006.01)
*G01B 11/06* (2006.01)
*C23C 16/52* (2006.01)
*C23C 14/12* (2006.01)

(52) U.S. Cl.
CPC ............... *C23C 16/52* (2013.01); *C23C 14/12* (2013.01); *C23C 14/24* (2013.01); *C23C 14/54* (2013.01); *C23C 14/547* (2013.01); *C23C 14/548* (2013.01); *G01B 11/0625* (2013.01)

(58) Field of Classification Search
None
See application file for complete search history.

(56) References Cited

U.S. PATENT DOCUMENTS 3,059,611 A * 10/1962 Arthur et al. ............. 118/665
3,400,687 A *  9/1968 Lueck ................... C23C 14/547
                                                    118/665

(Continued)

FOREIGN PATENT DOCUMENTS

JP         08285695 A  * 11/1996
JP       2002-148157 A    5/2002

(Continued)

OTHER PUBLICATIONS

Office Action Japanese Patent Application No. 2012-159296 dated Oct. 27, 2015.
Werner Bouschen et al., "Matrix vapor deposition/recrystallization and dedicated spray preparation for high-resolution scanning microprobe matrix-assisted laser desorption/ionization imaging mass spectrometry (SMALDI-MS) of tissue and single cells", Rapid Communications in Mass Spectrometry, 2010: 24: pp. 355-364.

Primary Examiner — Binu Thomas
(74) Attorney, Agent, or Firm — McDermott Will & Emery LLP

(57) ABSTRACT

To provide a sample preparation device that is appropriate for the formation of a matrix film for MALDI through vacuum vapor deposition. A sample preparation device is provided with: a sample substrate support unit 23 for supporting a substance to be analyzed on a substrate S so that the substance faces a vapor deposition source 21 for a matrix substance J; a light amount measurement unit for irradiating a matrix film vapor deposited on the substrate S with measurement light diagonally and detecting the amount of measurement light that has transmitted through or has been reflected from the above-described matrix film diagonally; and an adhesion prevention means 23a for preventing the matrix substance that has flown off from the above-described vapor deposition source 21 from adhering to the above-described light amount measurement unit.

7 Claims, 8 Drawing Sheets

(56) References Cited

U.S. PATENT DOCUMENTS

| | | | | |
|---|---|---|---|---|
| 4,140,078 | A | * | 2/1979 | Wilmanns ............... 118/665 |
| 4,676,646 | A | * | 6/1987 | Strand et al. ............ 356/632 |
| 5,745,240 | A | * | 4/1998 | Frakso et al. ............ 356/632 |
| 6,649,208 | B2 | * | 11/2003 | Rodgers .................. 118/712 |
| 2002/0155221 | A1 | * | 10/2002 | Baldwin et al. .......... 118/720 |
| 2004/0191407 | A1 | * | 9/2004 | Ohbayashi ............ 204/192.13 |

FOREIGN PATENT DOCUMENTS

| | | |
|---|---|---|
| JP | 2003-014923 A | 1/2003 |
| JP | 2003-202404 A | 7/2003 |
| JP | 2004-052088 A | 2/2004 |
| JP | 2005-281859 A | 10/2005 |

\* cited by examiner

SAMPLE PREPARATION DEVICE TO FORM A MATRIX FILM FOR MATRIX ASSISTED LASER DESORPTION/IONIZATION METHOD

RELATED APPLICATIONS

This application claims the benefit of Japanese Application No. 2011-264663, filed on Dec. 2, 2011, and Application No. 2012-159296, filed on Jul. 18, 2012, the disclosures of which Applications are incorporated by reference herein.

TECHNICAL FIELD

The present invention relates to a sample preparation device for MALDI that is used to form a matrix film when a sample to be analyzed in mass spectrometry using matrix assisted laser desorption/ionization method (MALDI) (also referred to as MALDI-MS) is prepared, and in particular to a sample preparation device for MALDI for forming a film of a matrix substance on the surface of a substance to be analyzed, such as a piece of a living body, in accordance with a vapor deposition method.

BACKGROUND ART

A spraying method, a dropping method and the like are generally known as methods for preparing a sample to be analyzed for MALDI-MS by applying a matrix substance onto a substance to be analyzed so as to form a matrix film. Organic substances, which absorb the used laser beam with a certain wavelength range well, are used as the matrix substance, and examples include 1,4-bisbenzene, 1,8,9-trihydroxy anthracene, 2,4,6-trihydroxy acetophenone, 2,5-dihydroxy benzoic acid, 2-(4-hydroxy phenyl azo) benzoic acid, 2-amino benzoic acid, 3-amino pyrazine-2-carboxylic acid, 3-hydroxy picolinic acid, 4-hydroxy-3-methoxy cinnamic acid, trans-indoleacrylic acid, 2,6-dihydroxy acetophenone, 5-methoxy salicylic acid, 5-chloro salicylic acid, 9-anthracene carboxylic acid, indole acetic acid, trans-3-dimethoxy-hydroxy cinnamic acid, α-cyano-4-hydroxycinnamic acid, 1,4-diphenyl butadiene, 3,4-dihydroxy cinnamic acid and 9-amino acridine.

Different matrix substances from among these are used as a matrix substance appropriate for analysis depending on the substance to be measured or the properties and the ion polarities of the substance to be detected.

In recent years, a mass imaging method according to which the state where living body molecules and metabolite are localized on a piece of tissue can be two-dimensionally visualized using MALDI-MS has been attracting attention.

In the mass imaging method, the amount of the matrix applied to the substance to be measured (film thickness) greatly affects the results of mass imaging using MALDI. Therefore, it is important to form a matrix film having high reproducibility and uniformity, and a film formation technology for this has been demanded.

Application in accordance with a spraying method has been commonly used so far for the formation of a matrix film. In general, manual operation using a hand spray by a skilled worker is necessary in the spraying method, and furthermore, it is necessary to prepare a matrix solution to be applied. In addition, the state of crystals in the applied matrix, the amount of application and the reproducibility are greatly affected by the degree of skill of the worker and the environment within the room, and therefore, it is necessary to prepare a matrix solution for satisfying meticulous conditions by using many samples (including spare samples) every time a sample is applied, even for the same sample. Though there are automated spray devices, they are currently inferior to the skilled workers in terms of the quality of spraying.

In recent years, a vacuum vapor deposition method according to which the formation of a film of microscopic crystals is possible has been attracting attention as a new method for forming a matrix film (see Patent Document 1). The matrix films made in accordance with the vacuum vapor deposition method can be prevented from being affected by the inconsistency in the degree of skill of the workers or the environment within the room. However, most matrix substances are heated in a powdered state so as to be deposited from a vapor resulting from sublimation. It is difficult to secure sufficient reproducibility with the deposition from a vapor resulting from sublimation due to a change in the vapor pressure caused by the inconsistency in the heat conductance of the vapor source (a boat for heating or the like) or the difference in the purity even when the temperature for heating the vapor source is precisely controlled. Therefore, reproducibility is secured by monitoring during vacuum vapor deposition the amount of application for the matrix film (film thickness) that adheres the substance to be analyzed.

A method for indirectly finding the thickness of a film that has adhered to the substrate on which a film is to be formed from the results of measurement of the thickness of the film that has adhered to an element for measuring the film thickness (substrate for measuring the film thickness or crystal oscillator) that is different from the sample substrate has been known, whereby in order to monitor the thickness of the film that has adhered to the sample substrate that is an object of which film is to be formed during vapor deposition, this element to be measured for measuring the film thickness is attached in a location away from the sample substrate within the vacuum chamber (in a location that does not hinder the film formation on the sample substrate). Concretely speaking, a film thickness measuring method for measuring the film thickness from the change in the transmittance (amount of light that has transmitted) when a substrate for measuring a film thickness is used as an element to be measured, and this substrate is irradiated with light from the outside of the vacuum container (see Patent Document 2), and a method for measuring a film thickness from the change in the frequency due to the adhesion of a film to a crystal oscillator (see Patent Document 3) are known as examples.

Though there are some cases where measurement of the thickness of a thin film using the effects of interference is possible, such a measurement cannot be used when the formed film absorbs light for measurement, and the measurement using the effects of interference is difficult unless the film thickness is in an appropriate range.

Here, in order to confirm the film thickness after completion of vapor deposition, a contact step gauge can be used.

PRIOR ART DOCUMENTS

Patent Documents

Patent Document 1: Japanese Unexamined Patent Publication 2002-148157
Patent Document 2: Japanese Unexamined Patent Publication 2004-052088
Patent Document 3: Japanese Unexamined Patent Publication 2003-202404

SUMMARY OF THE INVENTION

Problem to be Solved by the Invention

In the technology for forming a matrix film of a sample to be analyzed in MALDI-MS in accordance with a vacuum vapor deposition method, some conditions are different from those in general vapor deposition technology, and it has been demanded to solve the difficulties not found in conventional vapor deposition devices.

A first object is to form a uniform matrix film, and at the same time to make the amount of consumed matrix film as small as possible. In many cases, the substance to be analyzed of which a matrix film is to be formed is valuable and can be any of various types of substances with no substitute, for example, the pathological sample of a patient, and there are also cases where part of this pathological sample is desired to be used for analysis other than MALDI. In addition, the material of the matrix film is expensive in many cases. Therefore, it is required to form a film only in a region that is the minimum requirement (the smallest region required for mass imaging in the case of mass imaging) of a sample substrate to which an individual substance to be analyzed is pasted, and within this region, it is required for the film to have a desired thickness while maintaining the uniformity of the film required for mass imaging.

That is to say, in the technology for forming a matrix film of a sample to be analyzed in MALDI-MS, it is required to reduce the amount of consumed matrix substance by making the matrix substance fly off only in the vicinity of the sample substrate so that a required matrix film can be formed of a small amount of matrix substance, and it is also required for the formed matrix film to be uniform and have a film thickness that is optimal for the analysis.

In order to vapor deposit a uniform film on an object (sample substrate) while monitoring the film thickness in accordance with a vacuum vapor deposition method, the object (sample substrate) is attached to the inside of the vacuum container in a location a distance away from the vapor deposition source, and at the same time, an element to be measured, such as a substrate for measuring the film thickness or a crystal oscillator as in Patent Documents 2 and 3, is attached separately, and the substance to be vapor deposited may fly off in a broad range (broad solid angle) that includes the object (sample substrate) and the element to be measured. However, the greater the distance from the vapor deposition source, the greater the amount of the substance to be vapor deposited needs to fly off from the vapor deposition source in order to make the thickness of the adhered film the same, which consumes a large amount of a matrix substance that is expensive. Therefore, it is difficult to satisfy the necessary amount of consumption of the substance to be vapor deposited and the uniformity or the control of the film thickness at the same time.

In other words, it is desired in the technology for forming a matrix film through vapor deposition that the region for vapor deposition have a small area, and uniform vapor deposition within the range of a small area is possible with a small amount of matrix substance.

A second object is to make it possible to monitor the thickness of a matrix film (applied amount) formed on the substance to be analyzed in MALDI-MS directly on the substance to be analyzed or on the sample substrate to which the substance to be analyzed is pasted (slide glass).

In order to monitor the thickness of a film that has adhered to the sample substrate in accordance with the vacuum vapor deposition method, as described above, an element to be measured for measuring the film thickness is usually provided in addition to the sample substrate.

It is necessary for the element to be measured to be attached so as not to be an obstacle for the substance to be vapor deposited on the sample substrate along the flying off path, and therefore, the locations where the sample substrate and the element to be measured are attached within the vacuum container are away from each other. Thus, the thicknesses of the films that adhere to the two are usually different from each other, though there is a correlation with each other (almost a proportional relation). Therefore, the thicknesses of the films that are vapor deposited on the two at the same time are respectively measured in advance using a contact step gauge so that a correlation equation (proportionality constant) or the like is found, and afterwards, the thickness of the film that has adhered to the sample substrate can be calculated from the data on the film thickness that has been measured for the element to be measured and the found correlation equation.

In such a method for measuring the film thickness using an element to be measured, inconsistency depending on the location of the element to be measured is inevitable.

Furthermore, a space for an element to be measured becomes necessary so that the element to be measured can be attached without becoming an obstacle for the particles to be vapor deposited along the flying off path, and thus, it is necessary to spread the directions (solid angle) in which the particles to be vapor deposited fly off. Accordingly, it is preferable and desirable to measure the film thickness at a measurement point on the sample substrate (slide glass) on which a matrix film is to be formed without having an element to be measured attached.

There are some cases where the ratio of adhesion of the substance to be vapor deposited is different between the adhesion on the substance to be analyzed, such as a pathologic sample, and the adhesion on the sample substrate (metal plate, slide glass) or on the element to be measured, such as a crystal oscillator, to which the substance to be analyzed is pasted because the properties on the surface of the substrate are different. Therefore, the film thicknesses (amounts of application) of the matrix films having a film thickness of approximately 1 to 2 μm formed on the two may be slightly different. Accordingly, the film thickness measured on the sample substrate to which a substance to be analyzed is pasted in a place other than the substance to be analyzed may be slightly different from the actual film thickness on the substance to be analyzed. In such a case, it may be preferable to measure the thickness on the substance to be analyzed instead of the thickness on the substrate (metal plate, slide glass) in the vicinity of the substance to be analyzed even if the substrate is a sample substrate. In contrast, there are some cases where it is preferable to measure the thickness on the sample substrate in the vicinity of the substance to be analyzed because the state of the surface on the substance to be analyzed may not be appropriate for the measurement of the film thickness depending on the substance.

As described above, it is desirable in the technology for forming a matrix film as a sample to be analyzed in MALDI-MS to directly monitor the film thickness of a matrix film formed on the actual substance to be analyzed or the sample substrate to which the substance to be analyzed is pasted instead of monitoring the film thickness on the element to be measured.

It is also desirable for the film thickness to be measured in accordance with an optical method, which is a non-contact measuring method, at a point as close as possible to the measuring point for the measurement in MALDI-MS on the substance to be analyzed so that a matrix film having an optimal film thickness can be formed. There are cases where the film thickness cannot be measured in accordance with an optical measuring method using the effects of multiple interference of a thin film, though this is an optical method, because many matrix films are light absorbing films (DHB(2, 5-dihydroxy benzoic acid), for example. Accordingly, it is preferable to directly measure the film thickness using optical measurement of the amount of light that has passed through or that has been deflected from the matrix film.

In addition to the above-described objects, an object to increase the rate of vapor deposition on the sample substrate or on the substance to be analyzed while maintaining uniformity, an object to enhance the uniformity of the film using a simple structure other than a rotational mechanism (mechanism for rotating or revolving the object to be analyzed), and other conventional objects in the vacuum vapor deposition method have been required to be achieved.

Thus, the present invention is provided in order to achieve the above-described first and second objects at the same time, and another object of the invention is to provide a matrix film preparation device for MALDI that is appropriate for the preparation of a matrix film as a sample to be analyzed in MALDI-MS.

Means for Solving Problem

The sample preparation apparatus according to the present invention that has been made in order to achieve the above-described objects is a sample preparation apparatus for preparing a sample to be analyzed using a matrix assisted laser desorption/ionization method by forming a matrix film through vacuum vapor deposition at least on a substance to be analyzed on a sample substrate to which the substance to be analyzed is pasted, and has: a vapor deposition source for heating a matrix substance within a vacuum container so that the matrix substance is vapor deposited; a sample substrate support unit for supporting the sample substrate so that the subject to be analyzed on the sample substrate faces the vapor deposition source; a light amount measurement unit made up of a light source, which is provided within the vacuum container and diagonally irradiates the matrix film vapor deposited on the sample substrate with light for measurement, and a light detector for detecting the amount of light for measurement that has diagonally transmitted through or has been reflected from the matrix film vapor deposited on the sample substrate; and an adhesion prevention means for preventing the matrix material that has flown off from the vapor deposition source from adhering to the light amount measurement unit.

Here, the "substance to be analyzed" is a substance that is to be analyzed using MALDI, and an example of this is a thin slice of a living body.

In addition, the "sample substrate" is a substrate to which a substance to be analyzed is pasted, and thus is required to be flat, and slide glass is generally used for this. In the case where the amount of light that transmits through the matrix film is measured, it is necessary to use a light transmitting substrate, such as slide glass, through which light for measurement can transmit. In the case where the amount of light reflected from the side on which the matrix film is formed is measured, it is not necessary to use a light transmitting substrate, and the sample substrate may be a metal plate.

According to the present invention, the matrix substance that has been supplied to the vapor deposition source is heated and vapor deposited within a vacuum container so that a matrix film is deposited on the sample substrate (also on the substance to be analyzed) supported on the sample substrate support unit. A light amount measurement unit made of a light source for emitting light for measurement and a light detector is provided within the vacuum container, and therefore, the matrix film formed on the sample substrate (or on the substance to be analyzed on the sample substrate) is directly and diagonally irradiated with light for measurement from the light source so that the amount of light for measurement that has diagonally transmitted through or that has been reflected from the matrix film is measured by the light detector. The amount of transmitted light or reflected light varies depending on the film thickness of the matrix film that has been formed, and therefore, the film thickness of the matrix film that has been formed can be understood by monitoring the amount of light.

When the matrix film can be prevented from depositing on the light source or the light detector (that is, the light amount measurement unit) by means of an adhesion prevention plate, the distance between the light source and the light detector can be made close so that the measurement sensitivity can be increased, and at the same time, reproducibility can be prevented from becoming lower as a result of the effects from the adhesion on the light source or the light detector.

Effects of the Invention

According to the present invention, the film thickness of the matrix film directly formed on the sample substrate to which a substance to be analyzed is pasted is measured without an element for measurement being attached, and therefore, it is not necessary to take into consideration the space in which the element for measurement is installed. As a result, vapor deposition needs to be carried out only on the sample substrate, and therefore, the freedom in the location in which the sample substrate is attached increases, which makes it possible to make the sample substrate closer to the vapor deposition source so that the distance between the vapor deposition source and the sample substrate is short, and thus, the rate of vapor deposition and the efficiency in vapor deposition increase, and the consumed amount of the matrix substance can be reduced.

As for the region where uniformity is required for the film, uniformity is required only in the vicinity of the sample substrate on which a film is formed because no element for measurement is used, and therefore, no major problem arises even when the distance between the vapor deposition source and the sample substrate is shortened.

In addition, the film thickness of the sample substrate itself is measured, which means that the film thickness of the matrix film is directly measured in the location in the vicinity of the substance to be analyzed. Accordingly, there is no uncertainty in terms of the dependency on the location to be measured, and it is easy to precisely measure the film thickness, unlike in the case of measurement using a different element for measurement.

As the vapor deposition source in the above-described invention, it is preferable to use a vapor deposition source having directivity in vapor deposition such that the matrix substance flies off mainly in the direction in which the sample substrate faces the vapor deposition source.

As for the direction in which the matrix substance (substance to be vapor deposited) flies, in general, the matrix substance can be made to fly in almost any direction by selecting the form of the vapor deposition source and the heating method (wire heating, for example), and the matrix substance can be made to fly in the directions within a range of a solid angle with a certain direction at the center (boat heating, crucible heating or basket heating, for example). In the latter case, the target in the center direction is vapor deposited the most easily, and the amount of vapor deposition is smaller further away from the target. Therefore, the sample substrate can be placed in the center direction, and such a vapor deposition source that has directivity for making the matrix substance fly is selected so that efficient vapor deposition is carried out on the sample substrate. A common example is a vapor deposition method according to which a matrix substance is placed in a heating boat, a basket or a crucible, which provides a vapor deposition source having directivity.

In particular, a heating boat may have a lid with a hole (a number of holes are preferable) so that the substance for vapor deposition can fly in a certain direction through the hole in order to make vapor deposition having higher directivity possible.

As a result, efficient vapor deposition having a higher rate of vapor deposition and a lower consumed amount of a matrix substance is possible.

In addition, the light amount measurement unit is made of a light source for diagonally irradiating the matrix film and a light detector for detecting light for measurement that has diagonally passed through or been reflected from the matrix film, and therefore, the light source and the light detector can be installed in such locations that are away from the center direction in which vapor deposition can be easily carried out, and thus, a film can be prevented from adhering to the light amount measurement unit (light source or light detector).

In the above-described invention, the sample substrate support unit is formed of a support plate with an opening through which the substance to be analyzed on the sample substrate faces the vapor deposition source, and this support plate is formed so as to work as an adhesion prevention plate which prevents the matrix substance from the vapor deposition source from coming around into the space on the side opposite to the vapor deposition source with the support plate in between when the sample substrate is placed on the opening. In the case where the light source or the light detector of the light amount measurement unit is provided in the space on the opposite side, the support plate may work as an adhesion preventing means for the light source or the light detector.

When the support plate for supporting the sample substrate is also used as an adhesion prevention plate, the matrix substance can be easily prevented from adhering to the light source or the light detector of the light amount measurement unit that is provided in the space on the opposite side.

In addition, the support plate works as an adhesion prevention plate that prevents adhesion in the vicinity of the sample substrate, and therefore, the light source and the light detector can be placed close to the sample substrate in the space on the side opposite to the vapor deposition source with the support plate in between, and therefore, precision in the measurement can be made high.

In the above-described invention, a cover for covering the outside of the entirety, except for the surface through which light emits from the light source or the surface through which light enters into the light detector, and an adhesion prevention plate made of a number of aperture members that are arranged in front of the surface through which light is emitted from the light source or in front of the surface through which light enters into the light detector so that small holes in the aperture members are aligned in series in a coaxial manner may be used as the adhesion prevention means for the light source or the light detector of the light amount measurement unit.

As a result, the substance to be vapor deposited can enter into the inside of the cover only in the direction of the axis line along which small holes of the aperture members are aligned in a coaxial manner, and thus, a film can be prevented from adhering to the light source or the light detector almost completely during vapor deposition. In particular, when vapor deposition having the above-described directivity is carried out, the light source or the light detector can be prevented from being contaminated due to the vapor deposition when the direction of the axis line along which small holes of the aperture members are aligned is not the same direction in which the substance to be vapor deposited flies.

In the above-described invention, one of the light source and the light detector may be provided on the vapor deposition source side of the sample substrate support unit, and the other may be provided on the side opposite to the vapor deposition source with the sample substrate support unit in between so that the amount of light that has transmitted through the matrix film is detected.

In addition, in the above-described invention, the light source and the light detector may both be provided on the vapor deposition source side of the sample substrate support unit or may both be provided on the side opposite to the vapor deposition source with the sample substrate support unit in between so that the amount of light reflected from the matrix film is detected.

In the above-described invention, a film thickness reference information storing unit for storing film thickness reference information for finding the film thickness from the amount of light that has transmitted through or that has been reflected from the matrix film by measuring the relationship between the film thickness of the matrix film vapor deposited on the sample substrate and the amount of light that has transmitted through or that has been reflected from the matrix film, and a film thickness control means for controlling the film thickness of a matrix film to be formed on the sample substrate by allowing the light amount measurement unit to measure the amount of light that has transmitted through or that has been reflected from the matrix film being vapor deposited on the sample substrate and by controlling the degree of heating of the vapor deposition source on the basis of the measured amount of light and the film thickness reference information may be provided.

Here, the "film thickness reference information for finding the film thickness from the amount of light that has transmitted through or that has been reflected from the matrix film" may be stored as a mathematical formula, such as approximation, or may be stored as a table of measurement data on the film thickness and the amount of transmitted light or the amount of reflected light.

According to the present invention, the current film thickness can be understood on the basis of the film thickness reference information that has been stored in advance and the amount of transmitted light or the amount of reflected light measured during vapor deposition, and therefore, the degree to which the vapor deposition source is heated can be controlled so that the film thickness comes close to the target, and thus, the amount of the matrix substance flown into the space can be adjusted in order to control the film thickness.

As an application of the above-described invention, there is a case where two substances to be analyzed on one substrate are desired to be measured under optimal matrix conditions by using an optimal matrix substance for each substance.

In general, the matrix substances used in the MALDI method have a substance to be analyzed which is suitable for each matrix, and in many cases are not effective when used as a matrix for other substances. Therefore, it is necessary to prepare two samples to which one of the two different matrix substances is applied in order to measure two substances to be analyzed under optimal conditions (amount of application) using an optimal matrix substance, respectively.

As described above, however, most of the substances to be analyzed are valuable, such as pathological samples of patients, and in many cases, it is difficult to prepare samples on different substrates. In the case where a microscopic region on a substrate is desired to be measured, two types of matrixes are applied to two different microscopic regions that are approximate to each other on one substrate, which is very difficult.

Though in this case, it is possible to apply matrixes in two layers, it is difficult to adjust the intensity of the energy of the laser that is emitted at the time of analysis. In the case where the intensity of the energy is weak, for example, the laser does not reach to the sample, and only the matrix is ionized. Meanwhile, in the case where the intensity of the energy is strong, the matrix in the layer further away from the sample is lost without working on the sample, and thus, such a situation that only the matrix in the layer closer to the sample works on the sample, which is then ionized, can be expected.

Accordingly, it is considered to be effective to vapor deposit the two types of matrixes at the same time. However, the substances having different temperatures for sublimation or evaporation cannot be mixed for vapor deposition, and therefore, it is difficult to control the ratio of vapor deposition on the sample by adjusting the ratio of mixture of the materials to be vapor deposited.

In addition, in the measurement of a film thickness, two types of matrixes that fly at the same time cannot be differentiated for the measurement in accordance with the method using a crystal oscillator. Accordingly, it is difficult to control the mixture ratio of two types of matrixes or the film thickness (amount of application) by means of the film thickness gauge using a conventional crystal oscillator.

Therefore, additional objects of the present invention are to establish a device and a method for simultaneously vapor depositing two types of matrixes on two objects to be analyzed on one substrate (substances to be analyzed formed on a substrate) at a desired ratio as one application in the formation of a matrix film using the above-described matrix film preparation device for MALDI.

From the above-described point of view, the sample preparation device that is appropriate for the formation of matrix films by simultaneously vapor depositing two types of matrix substances at a desired ratio according to the invention is a sample preparation device for preparing a sample to be analyzed using a matrix assisted laser desorption/ionization method by forming through vacuum vapor deposition, at least on a substance to be analyzed on a sample substrate to which the substance to be analyzed is pasted, a matrix film where two types of matrix substances A and B (here, the transmittance TAa of a single substance film of the matrix substance A is higher than the transmittance TBb of a single substance film of the matrix substance B) are mixed, having; two vapor deposition sources for independently heating the above-described two types of matrix substances A and B within a vacuum container so that the matrix substances A and B are vapor deposited; a sample substrate support unit for supporting the sample substrate so that the substance to be analyzed on the above-described sample substrate faces both of the above-described two vapor deposition sources; a light amount measurement unit made up of a light source, which is provided within the above-described vacuum container and diagonally irradiates the matrix film vapor deposited on the above-described sample substrate with light for measurement, and a light detector for detecting the amount of light for measurement that has diagonally transmitted through or has been reflected from the matrix film vapor deposited on the above-described sample substrate; and an adhesion prevention means for preventing the matrix substances A and B that have flown off from the above-described two vapor deposition sources from adhering to the above-described light amount measurement unit, wherein the above-described light amount measurement unit has the light source using light with a certain wavelength that transmits through the matrix substance A, and at the same time is absorbed by the matrix substance B.

When light from the light source of the light amount measurement unit is such that the light transmits through the matrix substance A, and at the same time is absorbed by the matrix substance B, and a mixed film is formed of the matrix substance A and the matrix substance B, the transmittance of the mixed film changes depending on the amount of the applied matrix substance B. Therefore, the relationship between the film thickness (amount of application) of the matrix substance B and the transmittance is found in a preparatory experiment of film formation in advance so that the transmittance of the mixed film can be found when a mixed film is formed. This transmittance can be regarded as reflecting the absorption by the matrix substance B, and therefore, the amount of the applied matrix substance B included in the mixed film can be found. After that, the film thickness (amount of application) of the entirety of the mixed film is measured in accordance with another method (concretely, the use of a contact type film thickness gauge), and thus, the amount of the applied matrix substance A can also be found through subtraction of the film thickness (amount of application) of the matrix substance B from the entire film thickness (amount of application).

Thus, this method is embodied as the sample preparation method according to the invention that employs the above-described sample preparation unit to vacuum vapor deposit the above-described two types of matrix substances A and B at the same time on a substance to be analyzed, including the steps of: (a) vapor depositing the above-described matrix substance B as a single substance and finding the relationship between the transmittance $TB_B$ and the film thickness $DB_B$ of a single substance film B of the matrix substance B as "optical film thickness reference data;" (b) vapor depositing the above-described matrix substance A and the above-described matrix substance B at the same time under predetermined conditions for film formation so that a mixed film is formed, measuring the transmittance $TAB_B$ that varies depending on the amount of application of the above-described matrix substance B that is included in the mixed film formed under the predetermined conditions for film formation, and at the same time measuring the film thickness $DAB_{AB}$ of the entirety of the mixed film by using a contact type film thickness gauge, finding the relationship between predetermined conditions for film formation and the mixture ratio of the matrix substance A and the matrix substance B in the mixed film as "data on conditions for film formation/mixture ratio" in reference to the "optical film thickness reference data" on the above-described single substance film B, which are repeated, and storing the "data on conditions for film formation/mixture ratio" for the formation of a mixed film with a desired mixture ratio; and (c) setting the conditions for film formation corresponding to a certain mixture ratio in reference to the "data on conditions for film formation/mixture ratio" when a mixed film with the mixture ratio is formed as a substance to be analyzed, forming a film under the above-described conditions for film formation, and at the same time monitoring the transmittance $TAB_B$ in the formed film in reference to the "optical film thickness reference data" on the above-described single substance film B, and thus controlling the amount of application of the matrix substance B so that the amount of application has a desired value.

BEST MODE FOR CARRYING OUT THE INVENTION

Preferred Embodiments

Figure 1:
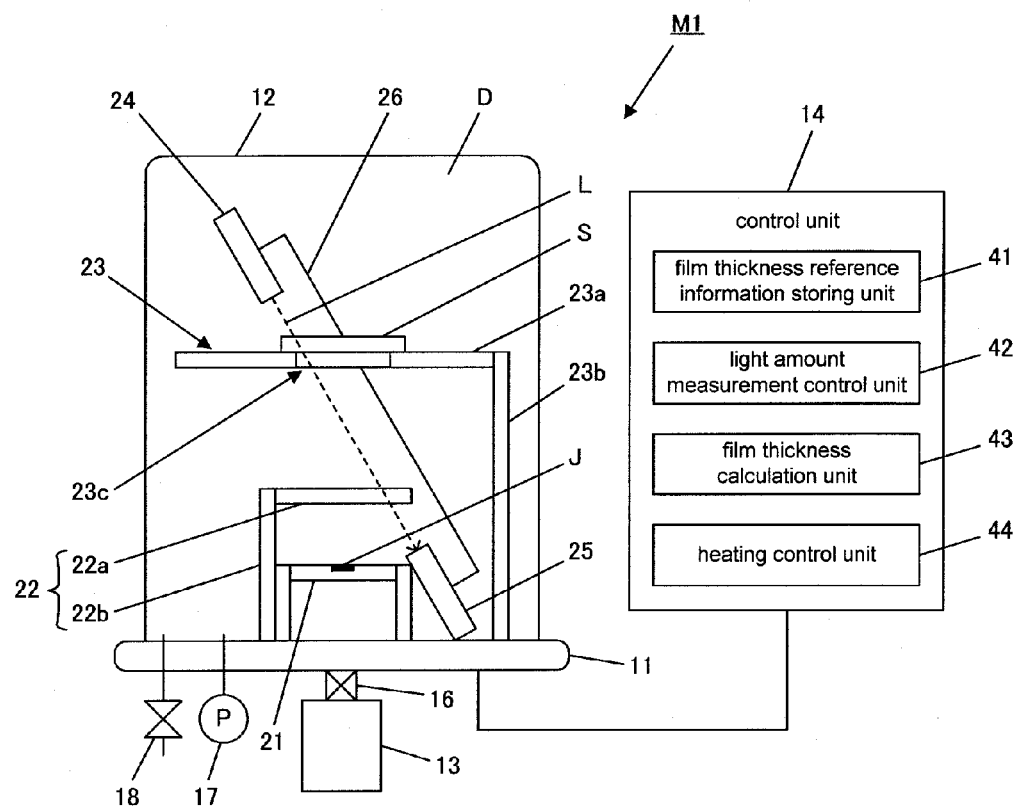
FIG. 1 is a schematic diagram showing the entire structure of the sample preparation device according to one embodiment of the present invention.

In the following, the embodiments of the present invention are described in reference to the drawings. FIG. 1 is a schematic diagram showing the entire structure of the sample preparation device M1 according to one embodiment of the present invention. The sample preparation device M1 is provided with a base 11, a vacuum chamber (vacuum container) 12 that can be opened and closed, a vacuum pump 13 and a control unit 14. The base 11 and the vacuum chamber 12 form a film formation chamber D that can maintain a vacuum state. The vacuum pump 13 is attached to the base 11 with a valve 16 in between, and furthermore, a vacuum meter 17 and a leak valve 18 are provided to the base 11.

A vapor deposition source 21, a shutter 22, a sample stage (sample substrate support unit) 23 on which a sample substrate S to which a substance to be analyzed is pasted is placed, a light source 24 for emitting light for measuring the film thickness, and a light detector 25 for detecting the light for measurement are provided inside the film formation chamber D.

The vapor deposition source 21 heats a matrix substance J in the film formation chamber D in a vacuum state so that the matrix substance J flies into the space as particles to be vapor deposited. The vapor deposition source 21 can be of a certain type from among a boat type, a basket type, a crucible type and a wire type, and an appropriate type is selected depending on the form and the amount of the used matrix substance J or on the direction in which the particles to be vapor deposited fly. Here, a boat type (boat for vapor deposition) is used so that the direction in which particles to be vapor deposited fly has directivity.

That is to say, in the boat type, the boat itself is in the path along which the particles to be vapor deposited fly, and therefore, the particles to be vapor deposited (matrix substance) do not fly towards the side beneath the boat. In addition, the particles rarely fly in the lateral direction relative to the boat, and thus, the particles to be vapor deposited fly mainly in the direction directly above the boat. In the case where an adhesion prevention plate (not shown) that covers the sides of the boat is attached, the direction in which the particles to be vapor deposited fly can be limited to a range of a narrower solid angle with the direction directly above at the center, and thus, the range of vapor deposition can further be limited.

Furthermore, in the boat type, the matrix substance J placed on the boat for vapor deposition can be heated by directly energizing the heater, and therefore, the temperature can be controlled relatively easily. That is to say, in the control of the temperature through heating by energizing the heater, the temperature is not directly measured, but rather a method for controlling the temperature by controlling the current or the voltage using the relationship between the temperature conditions and the value of the current for heating that has been evaluated in advance can be adopted. In order to measure the temperature precisely, a temperature measuring apparatus, such as a thermocouple, a platinum resistor or an infrared ray thermometer, may be used in or around the boat for vapor deposition so that the temperature can be directly measured. In addition, a number of boats for vapor deposition may be provided so that different types of matrixes can be flown simultaneously.

In the case where a basket type or a crucible type is used instead of a boat type, it is possible for the vapor deposition to have directivity.

The sublimation temperature of the matrix substance J for MALDI is usually 400° C. or lower, and therefore, the boat for vapor deposition is formed of a material that makes heating around this temperature possible. Examples used as the boat for vapor deposition include boats made of tungsten or molybdenum, which are common high melting point materials, and also boats made of stainless steel, Nichrome, ferrochrome, kanthal or other alloys having high resistivity.

Figure 2:
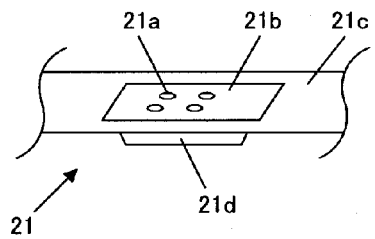
FIG. 2 is a diagram showing an example of a boat for vapor deposition (vapor deposition source in a boat shape)

Furthermore, as shown in FIG. 2, in the boat type vapor deposition source 21, a lid 21b with a number of holes 21a may be formed of the same material as the main body 21c of the boat, a matrix substance may be placed in a recess 21d of the boat 21c, and this lid 21b may cover the recess 21d so that particles for vapor deposition fly out only through the holes 21a, and thus, the direction in which the particles for vapor deposition fly is limited to a certain direction. The arrangement of the holes 21a at this time can be changed depending on the shape and the size of the region in the sample substrate S where uniform vapor deposition is desired. Thus, the path for the particles to be vapor deposited is limited so that a uniform matrix film can be formed in a necessary region without fail. Here, it is also possible to deliberately form an uneven film (with gradation) instead of a uniform film by changing the locations and the size of the holes 21a.

Though a powder material is used as the matrix substance that is supplied to the vapor deposition source 21, pellets made by solidifying a certain amount of the material or plates of the material may be used.

Though not described in detail, a substrate exchanging conveyance mechanism for exchanging the sample substrate S without losing vacuum in the film formation chamber D and a middle chamber for exchanging the substrate may be provided, and in addition, a mechanism for continuously supplying the matrix substance J may be provided so that a number of sample substrates S are exchanged one after another, and a matrix film can be prepared continuously.

The shutter 22 is made of a spindle 22a and a blocking plate 22b so that the blocking plate 22b can rotate around the spindle 22a in order to allow the matrix substance J (particles to be vapor deposited) moving upwards from the vapor deposition source 21 to be blocked or to pass through.

The sample stage 23 is made of a support plate 23a that is placed horizontally and a support rod 23b for supporting this. An opening 23c is created in the support plate 23a directly above the vapor deposition source 21, and a sample substrate S is placed on this opening 23c with the substance to be analyzed facing downward. Thus, the opening 23c is closed by the sample substrate S or by a blocking mask (not shown), leaving part of the region of the sample substrate S (portion to be analyzed by MALDI) so that the support plate 23a functions as an adhesion prevention plate for preventing the matrix substance J (substance to be vapor deposited) from coming around into the space above the support plate 23a.

Slide glass (26 mm×76 mm) or a metal plate is used as the sample substrate S. The height of the support plate 23a and the size of the opening 23c within the film formation chamber D are adjusted so that the location where the sample substrate S is placed is in a range of a solid angle to such an extent that the matrix substance J (particles to be vapor deposited) from the vapor deposition source 23 can be deposited on the entire surface of the sample substrate S.

As described above, the sample substrate S can be covered with a mask for preventing adhesion so that the matrix film can be prevented from adhering to the regions where vapor deposition is unnecessary.

In addition, a heating mechanism or a cooling mechanism may be provided to the support plate 23a in order to adjust the temperature of the sample substrate S.

An example used as the light source 24 is a laser diode that is compact and emits light having straightness. Though the wavelength of the light for measurement used herein is 635 nm, a laser beam having a wavelength of approximately 300 nm to 20,000 nm can be used, depending on the thickness of the matrix film to be measured. In addition, a tunable laser may be used so that the wavelength can be changed to be optimal for the used matrix substance J.

An example used as the light detector 25 is a photodiode, but there is no limitation to this as long as the device is compact and can detect the above-described range of wavelengths.

The light source 24 and the light detector 25 function as a light amount measurement unit when used as a pair.

The light source 24 is placed in a location above the support plate 23a and within the space where adhesion is prevented by the support plate 23a. The light detector 25 is placed to the side of the vapor deposition source 21 in such a location and position that the matrix substance J does not come around and make contact with the light detector 25. Here, an adhesion prevention plate (not shown) may be additionally provided between the vapor deposition source 21 and the light detector 25. In addition, the system is arranged so that the light axis L keeps the coaxial properties, where light for measurement from the light source 24 diagonally enters into the matrix film on the sample substrate S, the light for measurement that has transmitted through the matrix film progresses diagonally downward and enters into the light detector 25 diagonally from the above, and thus, the light for measurement is detected.

The light source 24 and the light detector 25 may be secured to the same frame so as to be integrated so that they can be secured as being coaxial. For example, an arm 26 that is bent so as to avoid the support plate 23a can form such an integration type frame.

In addition, a two-dimensional driving mechanism (or one-dimensional driving mechanism), not shown, is provided to this integration type frame so that the amount of light that has transmitted through the sample substrate S in any location can be measured. In accordance with another method, a two-dimensional movable stage is attached on top of the support plate 23a so that the sample substrate S can move along the optical axis L of the light for measurement.

In addition, the light source 24 and the light detector 25 have their own adhesion prevention means attached thereto.

FIGS. 3(a) to 3(c) are diagrams showing three examples of adhesion prevention plates attached to the light source 24 or the light detector 25. The light source 24 (light detector 25) is covered by a cylindrical cover 31, except for the surface on the side through which light is emitted (side through which light enters). A number of aperture members 33, 34, each of which has a small hole through which light for measurement passes, are aligned in series on the side 32 through which light is emitted from the light source 24 (on the side 32 through which light enters into the light detector) so that the small holes are aligned along the optical axis L of the light for measurement. Accordingly, the light for measurement enters or emits only through the hole in the aperture member 33, and only the particles to be vapor deposited that pass straight through the small holes can enter. This arrangement is placed, as shown in FIG. 1, so as to be diagonal relative to the direction in which the matrix substance J flies from the vapor deposition source to the sample substrate S, and thus, the light source 24 and the light detector 25 can be prevented from being contaminated with the matrix substance J.

Next, the control unit 14 of the sample preparation device M1 is described. The control unit 14 is a computer device formed of hardware, such as a CPU and a memory. When a software program for preparing a matrix film is run in the control unit 14, necessary processes, such as air exhaustion with a vacuum, control of the heating of the vapor deposition source, control of the opening and closing of the shutter, and the measurement of a film thickness by measuring the amount of light, are carried out. When the functions of the control unit 14 concerning the present invention are divided into blocks for description, the control unit 14 is provided with a film thickness reference information storing unit 41, a light amount measurement control unit 42, a film thickness calculation unit 43 and a heating control unit 44.

The film thickness reference information storing unit 41 converts the relationship between the film thickness of the matrix film and the transmittance (film thickness reference information) into a data table or a numerical expression, which is then stored in the memory.

This film thickness reference information is acquired by making matrix films having different film thicknesses (of the same matrix substance J as of the sample substrate S) adhere to a number of dummy sample substrates that are the same as the sample substrate S to be used for the preparation of a sample to be analyzed, by measuring the amount of light that has transmitted through the respective dummy sample substrates using the above-described light source 24 and light detector 25, and by measuring the film thickness of the matrix film adhering to each dummy sample substrate using a contact step gauge. This task is carried out in advance before a matrix film is formed on the sample substrate S as a preparatory measurement.

The light amount measurement control unit 42 controls the light source 24 and the light detector 25 so that they operate to continuously measure the amount of transmitted light at that time during the vapor deposition of a matrix film on the sample substrate S. Concretely speaking, the control is such that the initial value T0 when the matrix film has not yet been adhered is measured, and the results of measurement are outputted as the transmittance (T/T0).

The film thickness calculation unit 43 carries out an operation such that the film thickness of the matrix film at that time is calculated on the basis of the transmittance at that time measured by the light amount measurement control unit 42 and the above-described film thickness reference information.

The heating control unit 44 compares the calculated film thickness at that time to the target film thickness that has been preset and controls the amount of heating. Usually, the ON/OFF control for stopping heating at the point in time when the film thickness reaches the target is used, but a PID control according to which the current for heating is weakened as the film thickness approaches the target may be adopted.

Next, the operation of the sample preparation device M1 for preparing a matrix film on the sample substrate S is described. Here, a case where a matrix film is formed on the sample substrate S for MALDI-MS when DHB (2,5-dihydroxy benzoic acid) is used as the matrix substance is cited as an example.

Figure 4:
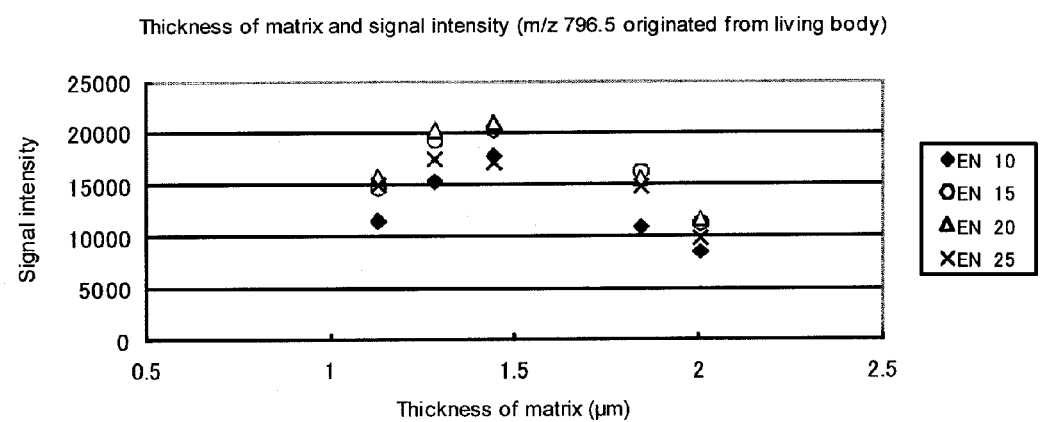
FIG. 4 is a graph showing data on the relationship between the film thickness of a matrix (DHB) and the signal intensity in MALDI-MS.

FIG. 4 shows data on the relationship between the film thickness of the DHB (matrix) formed on the sample substrate S and the signal intensity of MALDI-MS. Here, EN is a parameter denoting the intensity of the energy for irradiation with a laser. When the film thickness of the matrix film is in a range from 1 μm to 2 μm, there is a point in the vicinity of 1.4 μm where the signal intensity is maximum, and therefore, it is required to control the system so that the film thickness is approximately 1.4 μm in order to enhance the sensitivity for measurement.

Figure 5:
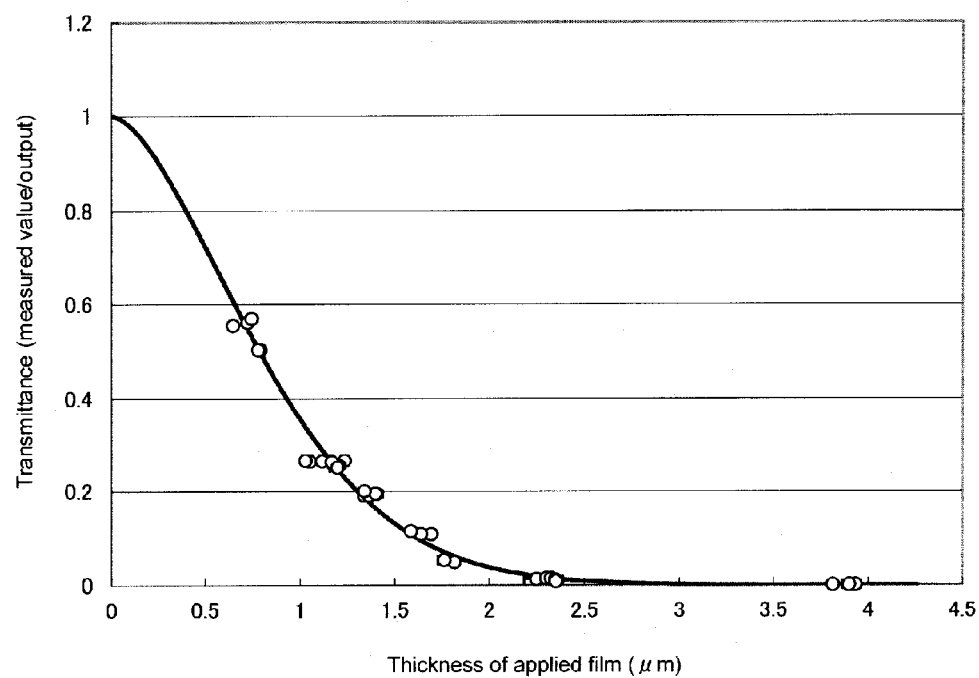
FIG. 5 is a graph showing data on the relationship between the film thickness of a matrix (DHB) and the transmittance.

FIG. 5 shows data on the relationship between the film thickness of DHB and the transmittance (thickness of applied film). When the film thickness is in a range from 1 μm to 2 μm, the transmittance changes in a range from 40% to 5%. When the transmittance is approximately 12%, the film thickness is 1.4 μm.

Accordingly, it can be understood that the control of the film thickness is possible by measuring the amount of transmitted light (transmittance) by the sample preparation device M1.

Before the start of the preparation of a sample, the relational expression (approximation) between the film thickness of DHB corresponding to the solid line in FIG. 5 and the transmittance (thickness of applied film) is stored in advance in the film thickness reference information storing unit 41. Here, the data gained from actual measurement may be stored as a data table instead of the approximation.

A sample substrate S is mounted, DHB is put on the vapor deposition source 21, the vacuum chamber 12 is closed, the air is exhausted from within the film formation chamber D for vacuum by means of a vacuum pump 13, and it is waited for until the pressure reaches to the point when vapor deposition is possible ($10^{-2}$ Pa, for example). During this time, the shutter 22 is opened so that the initial value (T0) of the amount of transmitted light is measured and stored in the film thickness calculation unit 43.

When the pressure reaches to the point when vapor deposition is possible, the heating in the vapor deposition source 21 is started in a state where the shutter 22 stays closed. The temperature for heating is controlled by the heating control unit 44 by controlling the amount of current that flows through the boat for vapor deposition, and the current is adjusted until the temperature reaches 130° C., which is the sublimation temperature of DHB. After it has been confirmed that the sublimation temperature has been reached and particles for vapor deposition stably fly off, the shutter 22 is opened so that vapor deposition on the sample substrate S starts.

At the same time, the light amount measurement control unit 42 operates the light source 24 and the light detector 25 so that the amount of transmitted light is repeatedly measured at constant time intervals and the transmittance is outputted.

The film thickness calculation unit 43 compares the transmittance outputted at that time with the film thickness reference information and calculates the film thickness at that time. If the film thickness at that time has not reached 1.4 μm, which is the target film thickness, the heating control continues. When the target film thickness is reached, the heating is stopped so that the vapor deposition stops.

As a result of the above-described operation, a matrix film having a desired film thickness is formed on the sample substrate S.

In the above-described example, a case where the change in the transmittance is a monotone decrease is described, where a periodic change due to interference by the thin film may be included depending on the film thickness. In this case, the number of waves of the intensity of the transmittance caused by interference can be counted so that the film thickness approaches the corresponding film thickness.

(Modifications)

Though the light source 24 is placed on the rear side of the sample substrate S (above the support plate 23*a*) in FIG. 1 so that the amount of transmitted light can be measured by the light detector 25 that is placed to the side of the vapor deposition source 21, the present invention is not limited to this, and there can be several modifications, such as one where the amount of reflected light is measured instead the amount of transmitted light, and therefore, these are described below. Here, the same symbols are attached to the same components as in FIG. 1, and thus, the descriptions thereof are not repeated. In the case where the amount of reflected light is measured, the relationship between the reflectance and the film thickness is naturally stored in the film thickness reference information storing unit 41.

Figure 6:
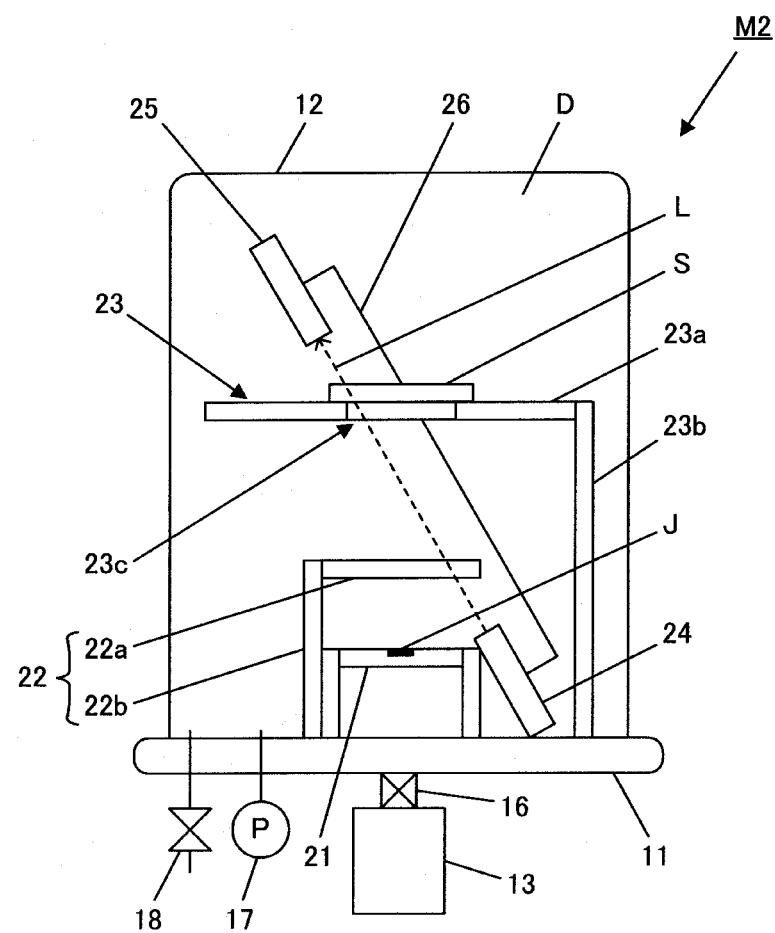
FIG. 6 is a schematic diagram showing a distinctive portion of the sample preparation device according to another embodiment of the present invention.

FIG. 6 shows another embodiment when the amount of transmitted light is measured. In this sample preparation device M2, the light source 24 is placed to the side of the vapor deposition source 21, and the light detector 25 is placed on the rear side of the sample substrate S.

Figure 7:
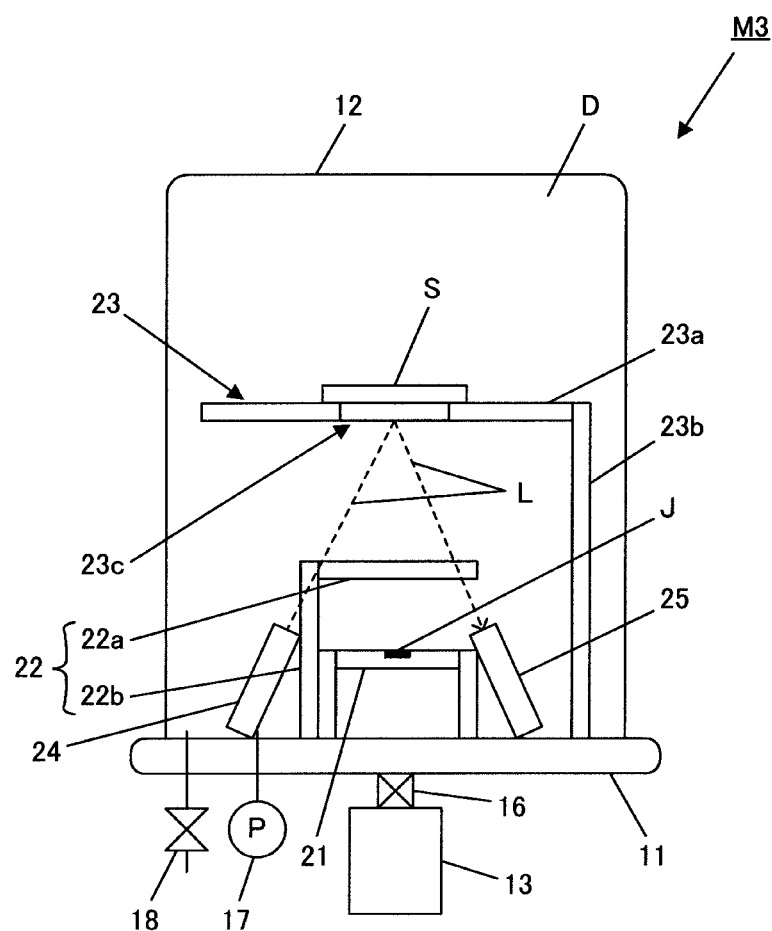
FIG. 7 is a schematic diagram showing a distinctive portion of the sample preparation device according to still another embodiment of the present invention.

FIG. 7 shows an embodiment for measuring the amount of light reflected from the vapor deposition source 21. In this sample preparation device M3, the light source 24 and the light detector 25 are both placed to the side of the vapor deposition source 21 so that light enters diagonally into and is emitted diagonally from the matrix film on the sample substrate S. In addition, a metal plate can be used for the sample substrate S.

When reflected light is measured, a light path is provided such that light for measurement passes through the matrix film twice (going and returning), and therefore, the precision of the measurement is generally high in comparison with the measurement of transmitted light. Meanwhile, tolerance in the measurement relative to a change in the thickness is smaller than that in the measurement for transmitted light.

Figure 8:
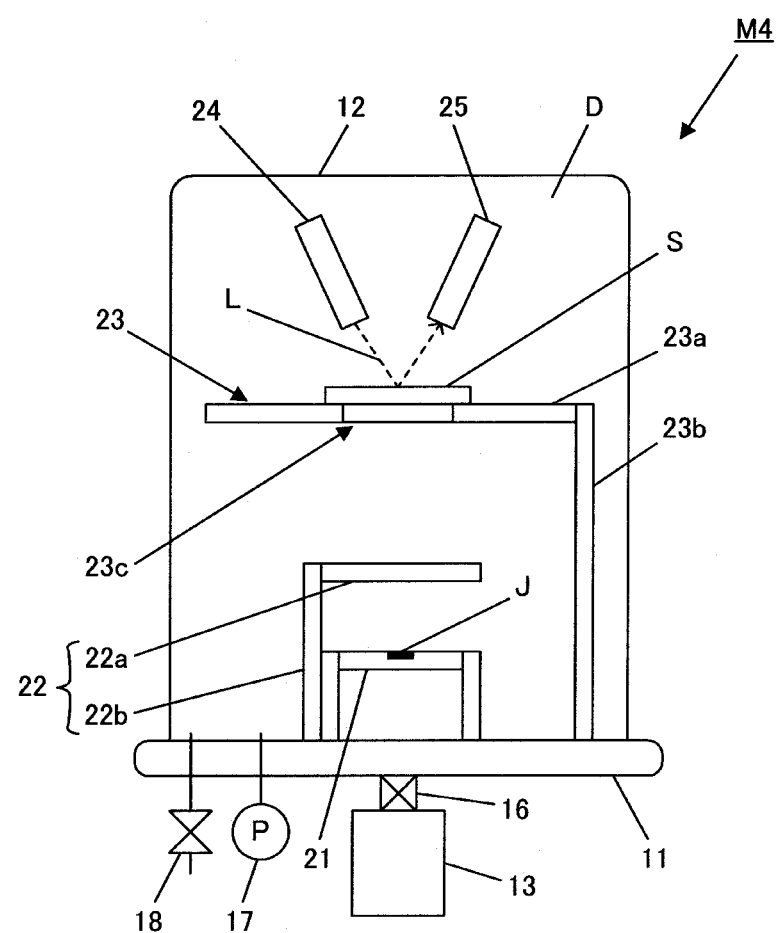
FIG. 8 is a schematic diagram showing a distinctive portion of the sample preparation device according to yet another embodiment of the present invention.

FIG. 8 shows an embodiment where the amount of reflected light is measured from the rear side of the support substrate 23a. In this sample preparation device M4, the light source 24 and the light detector 25 are both placed on the rear side of the support plate 23a so that light enters diagonally into the matrix film on the sample substrate S and is emitted diagonally from the matrix film. In this case, a light transmissive substrate, such as of slide glass, is used for the sample substrate S.

Figure 3:
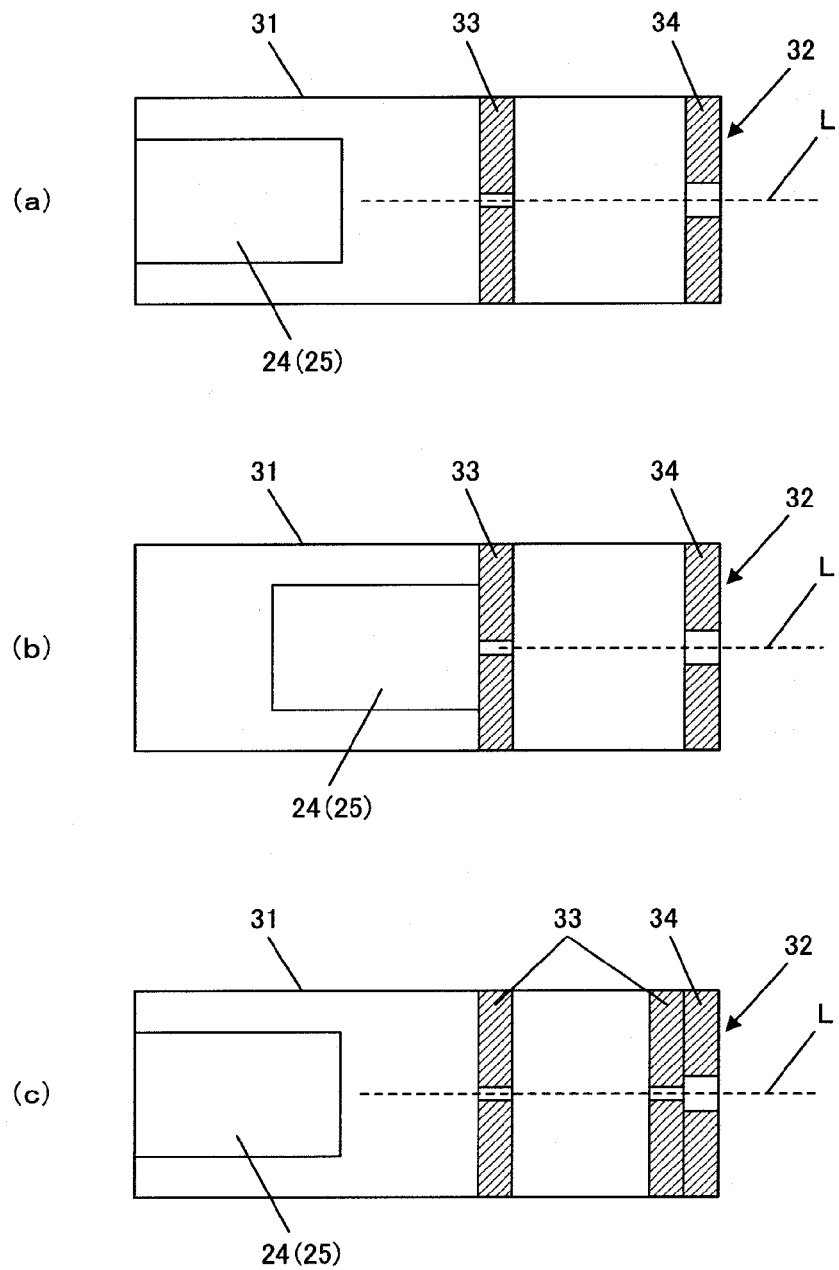
FIGS. 3(a) to 3(c) are diagrams showing examples of an adhesion prevention plate for the light source or the light detector.

In this case, the support plate 23a works as an adhesion prevention plate, and therefore, measurement is possible without providing a cover or an aperture member for adhesion prevention as in FIG. 3 to either the light source 24 or the light detector 25.

Figure 9:
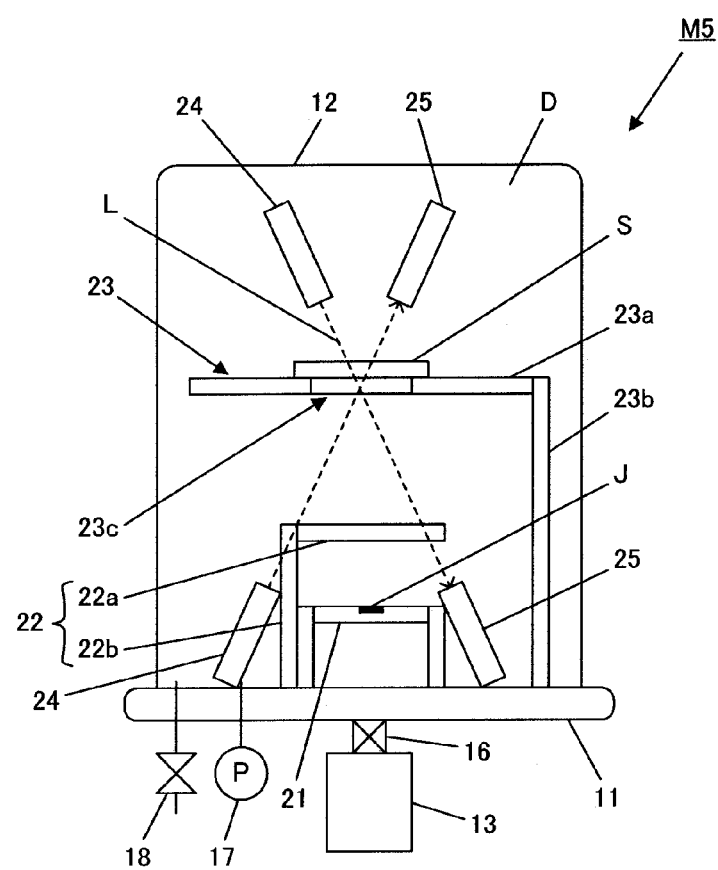
FIG. 9 is a schematic diagram showing a distinctive portion of the sample preparation device according to still yet another embodiment of the present invention.

In the sample preparation device M5 in FIG. 9, two pairs of a light source 24 and a light detector 25 are provided so that data in two places can be measured simultaneously.

In addition to the above, modifications are possible where the amount of transmitted light and the amount of reflected light are measured simultaneously or are selectively measured.

(Mixed Vapor Deposition of Two Types of Matrix Substances)

Next, as an example to which the present invention is applied, a sample preparation device that is preferable for the measurement of two substances to be analyzed on one sample substrate S under optimal matrix conditions where matrix substances that are optimal for the respective substances to be analyzed are used, as well as a sample preparation method using the same, are concretely described.

Figure 10:
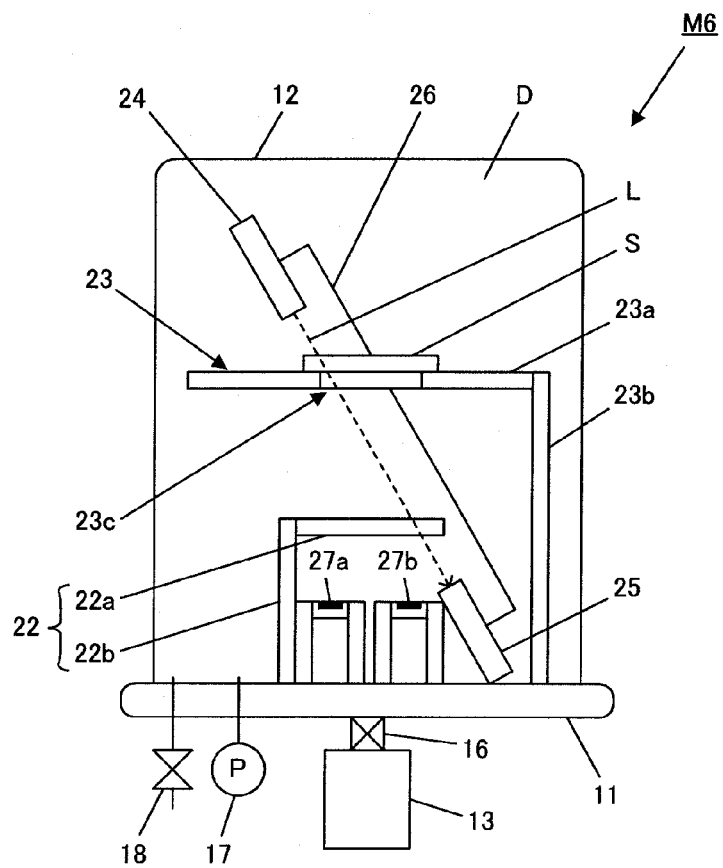
FIG. 10 is a schematic diagram showing a distinctive portion of the sample preparation device according to another embodiment of the present invention.

FIG. 10 is a diagram showing characteristic portions of the sample preparation device M6 according to one embodiment of the present invention. The same symbols are attached to the same components as in FIG. 1, and the descriptions thereof are omitted. In this sample preparation device M6, vapor deposition sources 27a and 27b are provided so that two matrix substances A and B can be vapor deposited simultaneously. These respectively have the same structure as the vapor deposition source 21 in FIG. 2 and are placed so as to face the opening 23c in the sample stage 23. The respective vapor deposition sources 27a and 27b are provided with a heating mechanism (not shown) so that heating is possible to a desired temperature independently.

Figure 11:
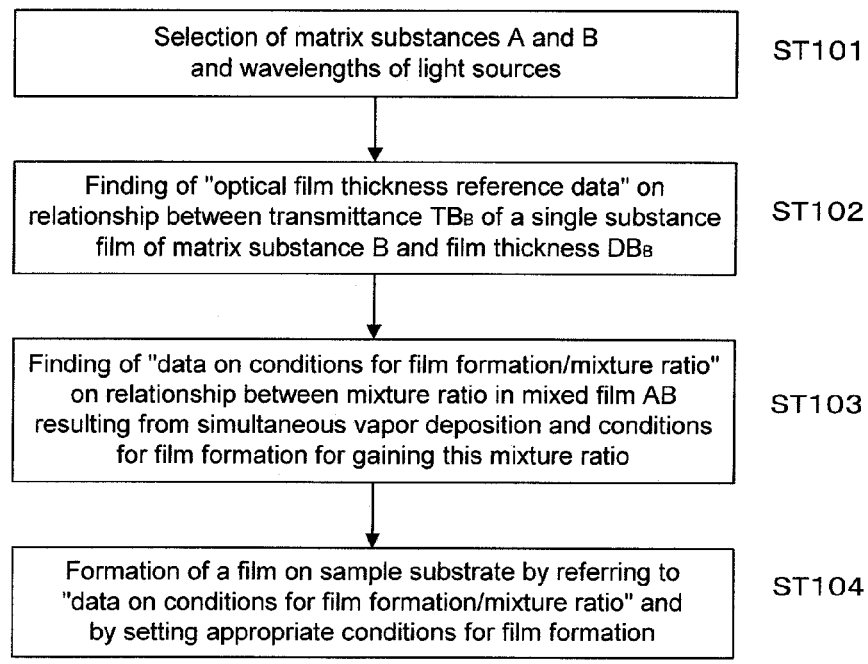
FIG. 11 is a flow chart showing a sample preparation method using the sample preparation device in FIG. 10.

FIG. 11 is a flow chart for describing the procedure according to which a sample is prepared using the above-described sample preparation device M6. In the following, a preferable sample preparation method is described in reference to the drawings.

When a sample is prepared, matrix substances A and B to be applied to the sample substrate S are selected (ST101). There are two conditions for selecting the matrix substances A and B. Under the first condition, the matrix substance A provides a matrix that is effective for one of the two types of substances to be analyzed which is to be measured, and the matrix substance B is a substance that is effective for the other substance to be analyzed. The matrix substances that are effective for analyzing substances that have been analyzed in the past are well known for each substance to be analyzed from the past analysis, while an appropriate matrix substance for a new substance to be analyzed is found by carrying out experiments through trial and error.

Under the other condition for a pair of matrix substances A and B, the film thickness (amount of application) of one matrix substance B can be optically measured without being affected by the other matrix substance A. In order to satisfy this condition, the types of matrix substances A and B and the wavelength of light from the light source 24 to be used are selected so that the transmittance for the matrix substance A exceeds 80% and a change in the transmittance due to the absorption in accordance with the film thickness can be measured for the matrix substance B.

In the case where the DHB (2,5-dihydroxy benzoic acid) that is described in FIGS. 4 and 5 is selected as the matrix substance B, for example, a laser diode that emits light with a wavelength of 635 nm is used, and a material of which the transmittance exceeds 80% for light with this wavelength 635 nm can be selected as the matrix substance A. A concrete example that can be selected as the matrix substance A is 9-AA (9-aminoacridine).

When the matrix substances A and B and the wavelength of light from the light source 24 to be used are determined, the matrix substance B is vapor deposited as a single substance, and thus, the relationship between the transmittance $TB_B$ of the matrix substance B, which is a single substance film B, and the film thickness $DB_B$ is found as "optical film thickness reference data" (ST102).

In the case where the matrix substance B is DHB, for example, the relationship between the transmittance and the thickness of the applied film shown in FIG. 5 is found as the "optical film thickness reference data."

Next, the relationship between the mixture ratio of the matrix substance A and the matrix substance B in the mixed film formed by simultaneously vapor depositing the matrix substances A and B on the sample substrate S and the conditions for film formation to provide this mixture ratio is found (ST103).

Concretely, simultaneous vapor deposition is carried out to form a mixed film AB of the matrix substance A and the matrix substance B under predetermined conditions for film formation that had been set through trial and error and the transmittance $TAB_B$ of the mixed film AB at the point in time when the film formation has been completed. At this time, the transmittance $TAB_B$ of the mixed film varies depending on the amount of application of the matrix substance B that is included in the mixed film AB formed under this condition for film formation. That is to say, the transmittance of the matrix substance A for the light from the light source 24 exceeds 80%, and therefore, the matrix substance A in the mixed film AB barely contributes to the absorption, making the absorption by the matrix substance B dominant, and therefore, the transmittance $TAB_B$ exhibits a similar dependency on the film thickness (amount of application) to that of the transmittance $TB_B$ of the single substance film B. Accordingly, the film thickness (amount of application) $DAB_B$ of the matrix substance B included in the mixed film AB can be found from the transmittance $TAB_B$ by referring to the "optical film thickness reference data" on the relationship between the transmittance $TB_B$ of the single substance film B and the film thickness $DB_B$ when the transmittance $TAB_B$ is given.

Furthermore, the entire film thickness $DAB_{AB}$ of the mixed film AB after the completion of the film formation an be measured as a step by means of a contact type film thickness gauge, and therefore, this is measured as the "entire film thickness $DAB_{AB}$." The entire film thickness $DAB_{AB}$ is a sum of the film thickness (amount of application) of the matrix A and the film thickness (amount of application) of the matrix substance B in the mixed film AB. Accordingly, the film thickness $DAB_A$ of the matrix substance A in the mixed film AB can be found by subtracting the film thickness (amount of application) $DAB_B$ of the matrix substance B in the mixed film AB that had been found from the transmittance $TAB_B$ in advance from the entire film thickness $DAB_{AB}$. As a result, the mixture ratio ($DAB_A:DAB_B$) of the mixed film AB can be found, and thus, the relationship with the conditions for film formation for gaining such a mixture ratio can be found.

Thus, the relationship between a desired mixture ratio and the conditions for film formation for gaining this mixture ratio is found as "data on conditions for film formation/mixture ratio," and this is repeated so that the "data on conditions for film formation/mixture ratio" is stored for the formation of mixed films with desired mixture ratios.

After the above-described preparation, the "data on conditions for film formation/mixture ratio" is referred to so that the conditions for film formation corresponding to a desired mixture ratio are set when a mixed film with this mixture ratio is formed of the substance to be analyzed on the sample substrate S, which is actually measured. Then, a film is formed under this condition for film formation (ST104). At this time, the "optical film thickness reference data" on the single substance film B is referred to so that the transmittance $TAB_B$ during film formation can be monitored, and thus, the film thickness (amount of application) is controlled so that the amount of application of the matrix substance B has a desired value. The matrix substance A at this time can be automatically found from the mixture ratio ($DAB_A:DAB_B$) of the mixed film AB, and therefore, the entire film thickness can also be controlled.

Thus, the film formation is stopped at the point in time when the matrix substance B has reached a desired film thickness (amount of application) that is found through monitoring of the transmittance TABB. As a result, a mixed film AB having a mixture ratio ($DAB_A:DAB_B$) where the film thickness (amount of application) $DAB_B$ of the matrix substance B has a desired value can be formed under good control.

INDUSTRIAL APPLICABILITY

The present invention can be applied to sample preparation devices and sample preparation methods for preparing a matrix film on a sample substrate for MALDI.

EXPLANATION OF SYMBOLS

M1 sample preparation device
11 base
12 vacuum chamber (vacuum container)
13 vacuum pump
14 control unit
21 vapor deposition source
23 sample stage (sample substrate support unit)
23a support plate (adhesion prevention means)
23c opening
24 light source
25 light detector
27a vapor deposition source
27b vapor deposition source
41 film thickness reference information storing unit
42 light amount measurement control unit
43 film thickness calculation unit
44 heating control unit

What is claimed is:

1. A sample preparation apparatus for forming a matrix film at least on a subject pasted on a sample substrate to prepare a sample, the subject in the sample being analyzed using a matrix assisted laser desorption/ionization method, the sample preparation apparatus comprising:
    a vacuum container;
    a vapor deposition source disposed in the vacuum container and configured to heat a matrix material so that the matrix material is vapor deposited on the subject to form the matrix film;
    a sample substrate support configured to support the sample substrate so that the subject to be analyzed on the sample substrate faces the vapor deposition source;
    a light source disposed in the vacuum container to emit light obliquely incident on the matrix film on said sample substrate, the light source having a light emitting surface from which the light is emitted, and
    a light detector disposed in the vacuum chamber to receive light from the matrix film for detecting an amount of light transmitted through or reflected from the matrix film, the light detector having a light receiving surface through which the light from the matrix film is received;
    an adhesion protector configured to prevent the matrix material from adhering to the light source and the light detector during the vapor deposition of the matrix material on the subject; and
    a processor, associated with the light source and the light detector, configured to control the vapor deposition source to form the matrix film in an area of the sample to have a predefined thickness for the matrix assisted laser desorption/ionization method, wherein
    the adhesion protector includes:
        a first aperture member disposed in front of the light emitting surface of the light source, the first aperture member having an aperture through which the light from the light source passes, the aperture of the first aperture member being positioned to arrange an optical axis of the light from the light source to be inclined with respect to a path of the matrix material from the vapor deposition source to the sample substrate for vapor deposition; and
        a second aperture member disposed in front of the light receiving surface of the light detector, the second aperture member having an aperture through which the light from the matrix film passes, the aperture of the second aperture member being positioned to arrange an optical axis of the light from the matrix film to be inclined with respect to the path of the matrix material from the vapor deposition source to the sample substrate for vapor deposition.

2. The sample preparation device according to claim 1, wherein
    said sample substrate support is formed of a support plate where an opening through which the subject to be analyzed on said sample substrate faces said vapor deposition source is provided,
    said support plate is formed so as to work as an adhesion prevention plate in such a manner that the matrix material from said vapor deposition source is prevented from coming around to a space on a side opposite to said vapor deposition source with the support plate in between when said sample substrate is placed on said opening, and
    said support plate works as the adhesion protector for said light source or said light detector in a case where the light source or the light detector is provided in said space on the opposite side.

3. The sample preparation device according to claim 1, wherein the adhesion protector includes an adhesion prevention plate made of a cover for covering an outside of the light source or said light detector, except for the light emitting surface through which light is emitted from the light source or the light receiving surface through which light enters into the light detector.

4. The sample preparation device according to claim 1, wherein one of said light source and said light detector is provided on the vapor deposition source side of said sample substrate support, and the other is provided on a side opposite to the vapor deposition source with said sample substrate support in between so that the amount of light that has transmitted through said matrix film is detected.

5. The sample preparation device according to claim 1, further comprising a storage for storing film thickness reference information for finding a film thickness from the amount of light to be transmitted through or reflected from the matrix film by measuring the relationship between the film thickness of the matrix film on said sample substrate and the amount of light to be transmitted through or reflected from the matrix film, wherein
the processor is further configured to control the film thickness of the matrix film to be formed on the sample substrate by allowing the light source and detector to measure the amount of light from the matrix film being vapor deposited on the sample substrate and by controlling a degree of heating of said vapor deposition source on the basis of the measured amount of light and said film thickness reference information.

6. A sample preparation device for preparing a sample to be analyzed using a matrix assisted laser desorption/ionization method by forming through vacuum vapor deposition, at least on a substance to be analyzed on a sample substrate to which the substance to be analyzed is pasted, a matrix film where two types of matrix substances A and B are mixed, comprising:
two vapor deposition sources for independently heating said two types of matrix substances A and B within a vacuum container so that the matrix substances A and B are vapor deposited;
a sample substrate support unit for supporting the sample substrate so that the matrix substances A and B to be analyzed on said sample substrate faces both of said two vapor deposition sources;
a light amount measurement unit made up of a light source, which is provided within said vacuum container and diagonally irradiates the matrix film vapor deposited on said sample substrate with light for measurement, and a light detector for detecting an amount of light for measurement that has diagonally transmitted from the matrix film vapor deposited on said sample substrate, the light source having a light emitting surface from which the light is emitted, the light detector having a light receiving surface through which the light from the matrix film is received; and
an adhesion protector configured to prevent the matrix substances A and B from adhering to the light source and the light detector during the vapor deposition of the matrix substances A and B, wherein
said light amount measurement unit has the light source using light with a certain wavelength that transmits through the matrix substance A, and at the same time is absorbed by the matrix substance B, and
the adhesion protector includes:
a first aperture member disposed in front of the light emitting surface of the light source, the first aperture member having an aperture through which the light from the light source passes, the aperture of the first aperture member being positioned to arrange an optical axis of the light from the light source to be inclined with respect to a path of the matrix substances A and B from the two vapor deposition sources to the sample substrate for vapor deposition; and
a second aperture member disposed in front of the light receiving surface of the light detector, the second aperture member having an aperture through which the light from the matrix film passes, the aperture of the second aperture member being positioned to arrange an optical axis of the light from the matrix film to be inclined with respect to the path of the matrix substances A and B from the two vapor deposition sources to the sample substrate for vapor deposition.

7. The sample preparation device according to claim 1, wherein the adhesion protector further includes:
a third aperture member disposed in front of the first aperture member, the light emitting surface, the first aperture member, and the third aperture member being arranged in that order along the optical axis of the light from the light source, the third aperture member having an aperture through which the light from the light source passes, the apertures of the first and third aperture members being positioned to arrange the optical axis of the light from the light source to be inclined with respect to the path of the matrix material from the vapor deposition source to the sample substrate for vapor deposition, and
a fourth aperture member disposed in front of the second aperture member, the light receiving surface, the second aperture member, and the fourth aperture member being arranged in that order along the optical axis of the light from the matrix film, the fourth aperture member having an aperture through which the light from the matrix film passes, the apertures of the second and fourth aperture members being positioned to arrange the optical axis of the light from the matrix film to be inclined with respect to the path of the matrix material from the vapor deposition source to the sample substrate for vapor deposition.

* * * * *